(12) United States Patent
Yeh et al.

(10) Patent No.: US 7,666,022 B2
(45) Date of Patent: Feb. 23, 2010

(54) ELECTRICAL CONNECTOR HAVING IMPROVED LOAD PLATE

(75) Inventors: Hung-Yang Yeh, Tu-cheng (TW); Cheng-Chi Yeh, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/319,296

(22) Filed: Jan. 5, 2009

(65) Prior Publication Data
US 2009/0176397 A1 Jul. 9, 2009

(30) Foreign Application Priority Data
Jan. 5, 2008 (CN) .................... 2008 2 0030611 U

(51) Int. Cl.
*H01R 13/62* (2006.01)
(52) U.S. Cl. ......................................... 439/331; 439/73
(58) Field of Classification Search ................. 439/331, 439/330, 71, 73, 526, 525
See application file for complete search history.

(56) References Cited

U.S. PATENT DOCUMENTS

| | | | |
|---|---|---|---|
| 6,758,691 B1 * | 7/2004 | McHugh et al. | 439/331 |
| 6,776,642 B1 * | 8/2004 | McHugh et al. | 439/331 |
| 6,799,978 B2 * | 10/2004 | Ma et al. | 439/73 |
| 6,877,990 B2 | 4/2005 | Liao | |
| 6,948,947 B2 | 9/2005 | Lee | |
| 7,025,603 B2 * | 4/2006 | Ma | 439/73 |
| 7,234,955 B1 | 6/2007 | Ho | |
| 7,241,161 B2 | 7/2007 | Mar | |

\* cited by examiner

*Primary Examiner*—Hien Vu
(74) *Attorney, Agent, or Firm*—Andrew C. Cheng; Wei Te Chung; Ming Chieh Chang

(57) ABSTRACT

An electrical connector is for electrically connecting an electronic package with a circuit substrate. The connector includes a housing having a plurality of conductive terminals, a fastening device including a load plate for pressing the electronic package and a retaining member for securing the load plate. The load plate defines a first edge, a second edge opposite to the first edge, a third edge pivoted to the fastening device and a fourth edge adjacent to the first edge and the second edge. The four edges jointly define an opening in the middle thereof with the first and second edges each having a pressing portion. Corners of the opening near the third edge extend upwardly. During the rotation of the load plate, the pressing portions will abut against the electronic package prior to the corners near the third edge, and thereby prevent the corners from abutting against the electronic package.

3 Claims, 6 Drawing Sheets

ELECTRICAL CONNECTOR HAVING IMPROVED LOAD PLATE

BACKGROUND OF THE INVENTION

1. Field of the Invention

The present invention relates to an electrical connector for electrically connecting an electronic package such as a central processing unit (CPU) with a circuit substrate such as a printed circuit board (PCB).

2. Description of Prior Art

A conventional electrical connector for electrically connecting a CPU (not shown) with a PCB (not shown) generally comprises a housing, a plurality of contacts and a fastening device assembled with the housing for securing the CPU. The fastening device generally comprises a pressing member for pressing the CPU and a retaining member for securing the pressing member. Generally, the retaining member is a frame seated around the housing and including an opening for receiving the housing therein, such electrical connector is found in U.S. Pat. No. 6,877,990 issued to Liao on Apr. 12, 2005. The retaining member of Liao '990 is integrally formed with metal material. Moreover, the retaining member may be of an assembled set, which has two or three separated parts. The retaining member is preliminarily assembled onto the housing then mounted onto the PCB, or the retaining member is directly positioned onto the PCB. Conventional electrical connector as described above is found in U.S. Pat. No. 7,234,955 issued to Ho on Jun. 26, 2007 and U.S. Pat. No. 7,241,161 issued to Ma on Jul. 10, 2007.

U.S. Pat. No. 6,948,947 issued to Lee on Sep. 27, 2005 disclosed an electrical connector relating to the present invention. The electrical connector includes an insulative housing, a stiffener surrounding the housing, a load plate pivotably assembled with one end of the stiffener and a load lever pivotably attached to the other end of the stiffener. The load plate defines a pair of pressing portions. Each of the pressing portions defines a wider part and a narrower part. During the rotation process of the load plate, the wider part firstly presses a pressing point of the IC package. Obviously, because width of the narrower part is small, strength of said narrower part is lower. Thereby, strength of the whole load plate is reduced and problem of stress concentration easily occurs in region of the narrower part. Accordingly, mechanical and electrical connection between the electronic package and the printed circuit board is unsteady.

In view of the above, an improved electrical connector that overcomes the above-mentioned disadvantages is desired.

SUMMARY OF THE INVENTION

Accordingly, an object of the present invention is to provide an electrical connector for electrically connecting an electronic package such as a central processing unit (CPU) with a circuit substrate such as a printed circuit board (PCB), which enables reliable mechanical and electrical connection between an integrated circuit package and a printed circuit board.

To achieve the above-mentioned object, an electrical connector in accordance with a preferred embodiment of the present invention is for electrically connecting a CPU with a PCB. An electrical connector is for electrically connecting an electronic package with a circuit substrate. The connector includes a housing having a plurality of conductive terminals, a fastening device including a load plate for pressing the electronic package and a retaining member for securing the load plate. The load plate defines a first edge, a second edge opposite to the first edge, a third edge pivoted to the fastening device and a fourth edge adjacent to the first edge and the second edge. The four edges jointly define an opening in middle of the load plate with the first and second edges each having a pressing portion. Corners of the opening near the third edge extend upwardly. During the rotation of the load plate, the pressing portions will abut against the electronic package prior to the corners near the third edge, and thereby prevent the corners from abutting against the electronic package.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
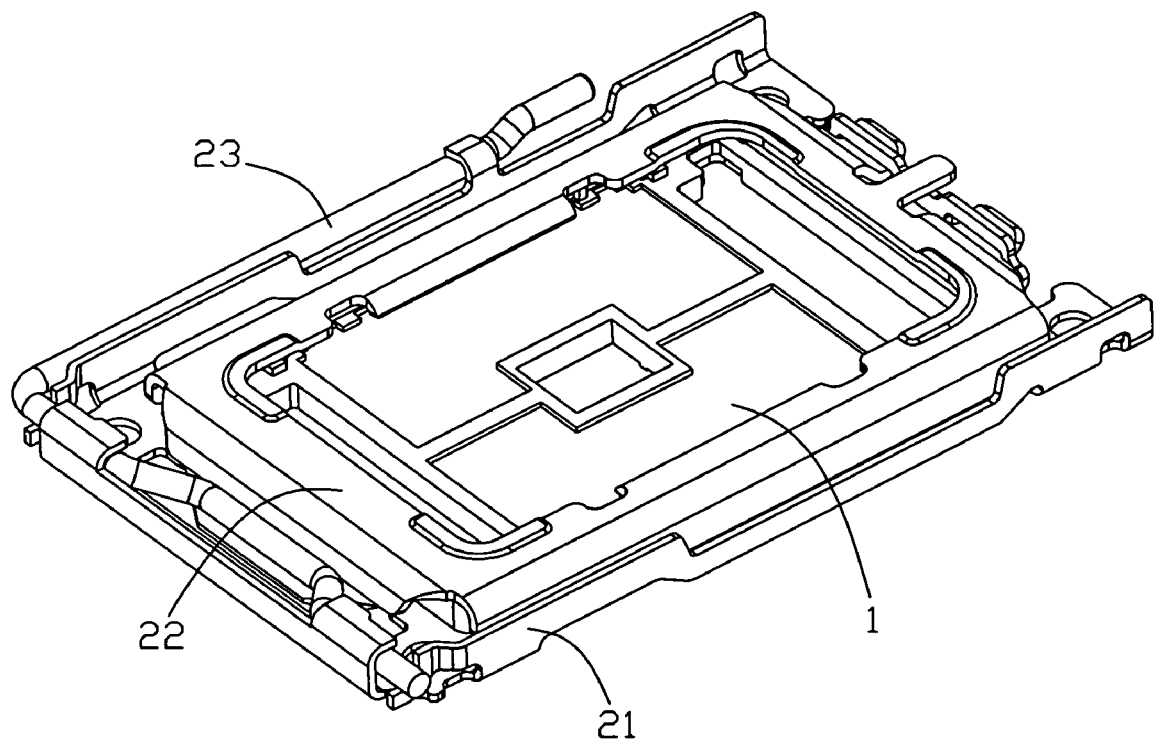
FIG. 1 is an assembled, isometric view of an electrical connector in accordance with a preferred embodiment of the present invention.
Figure 2:
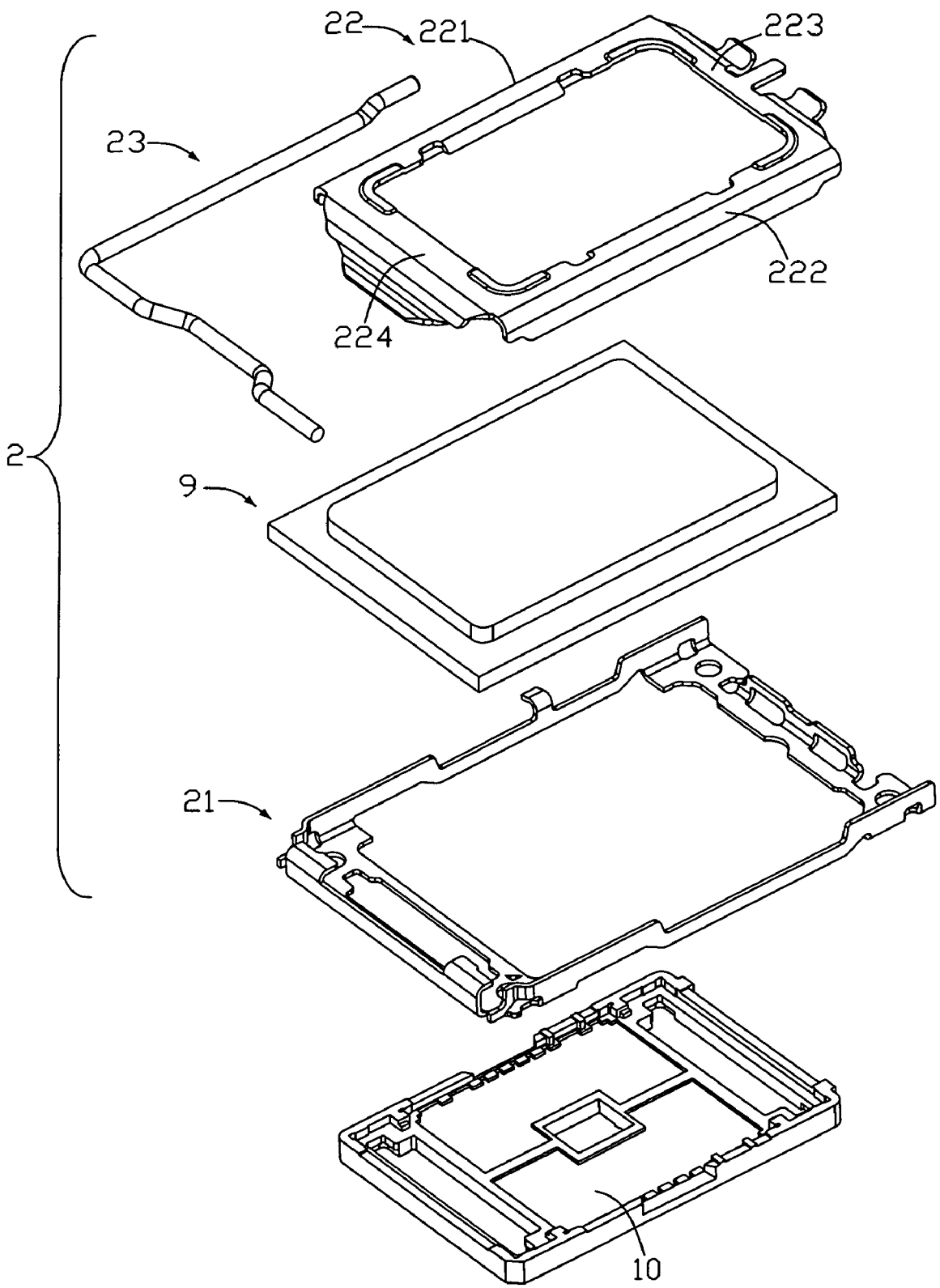
FIG. 2 is an exploded, isometric view of the electrical connector of FIG. 1.
Figure 3:
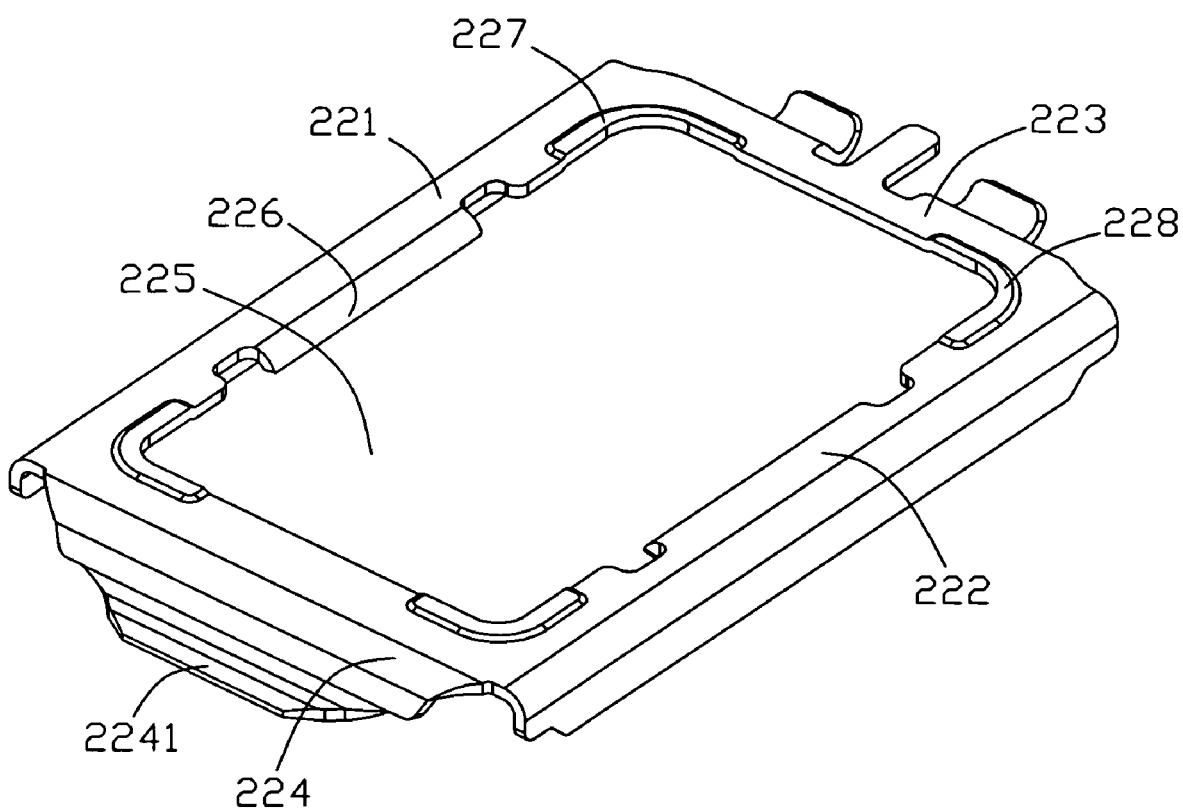
FIG. 3 is a perspective view of the load plate of the electrical connector.
Figure 4:
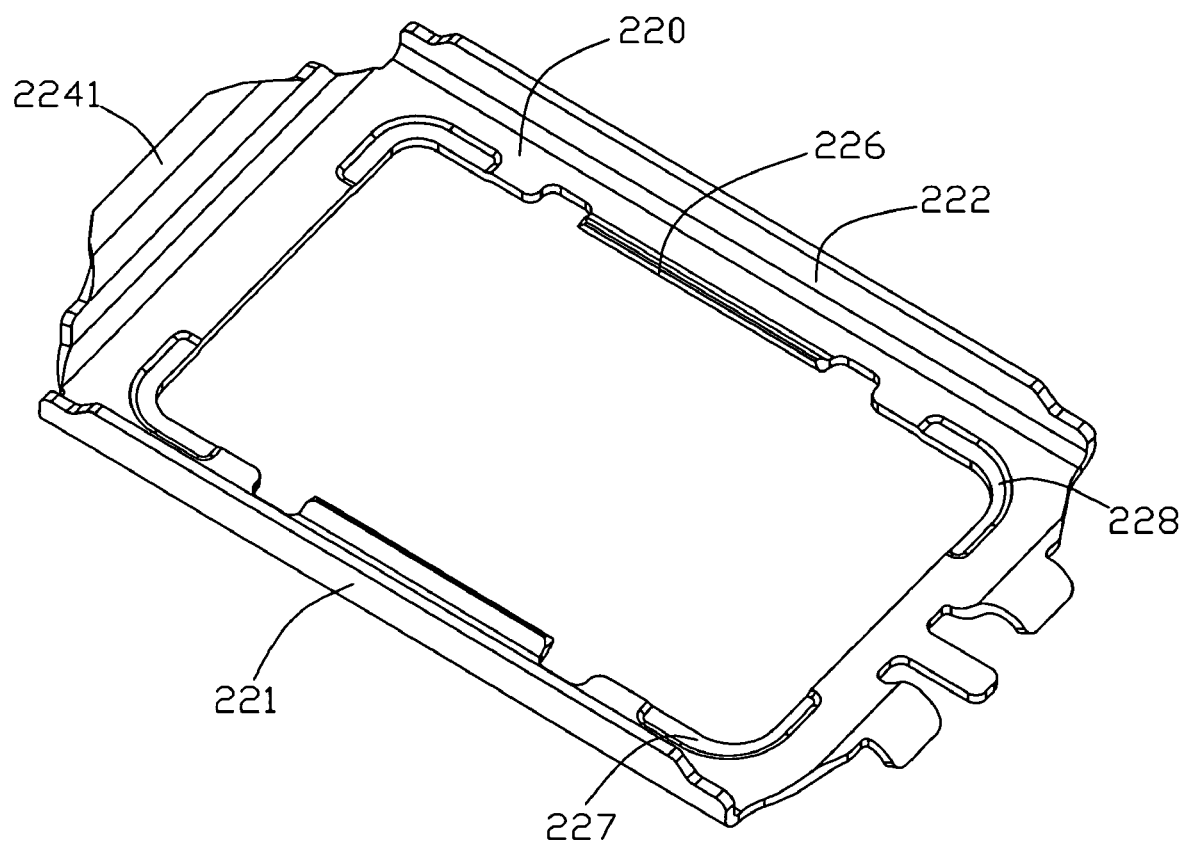
FIG. 4 is a perspective view of the load plate of the electrical connector; from another angle.

Referring to FIGS. 1-2, an electrical connector in accordance with the preferred embodiment of the present invention is used for electrically connecting an electrical package 9 with a circuit substrate (not shown). The connector comprises an insulative housing 1 with a plurality of conductive terminals (not shown) received therein; a fastening device 2 cooperated with the housing 1 for securing the electronic package. The housing 1 comprises a receiving area 10 for supporting the electronic package, said conductive terminals receiving in the receiving area 10. The fastening device 2 comprises a securing member including a retaining member 21 surrounding the housing 1 and a load lever 23 pivotably assembled with one end of the retaining member 21, a load plate 22 pivoted to the retaining member 21. The load lever 23 is for securing the load plate 22 onto the retaining member 21. The fastening device 2 is used for securing the electrical package 9 in the housing 1. The load plate 22 can rotates in a vertical plane from an opening position to a closed position.

Figure 5:
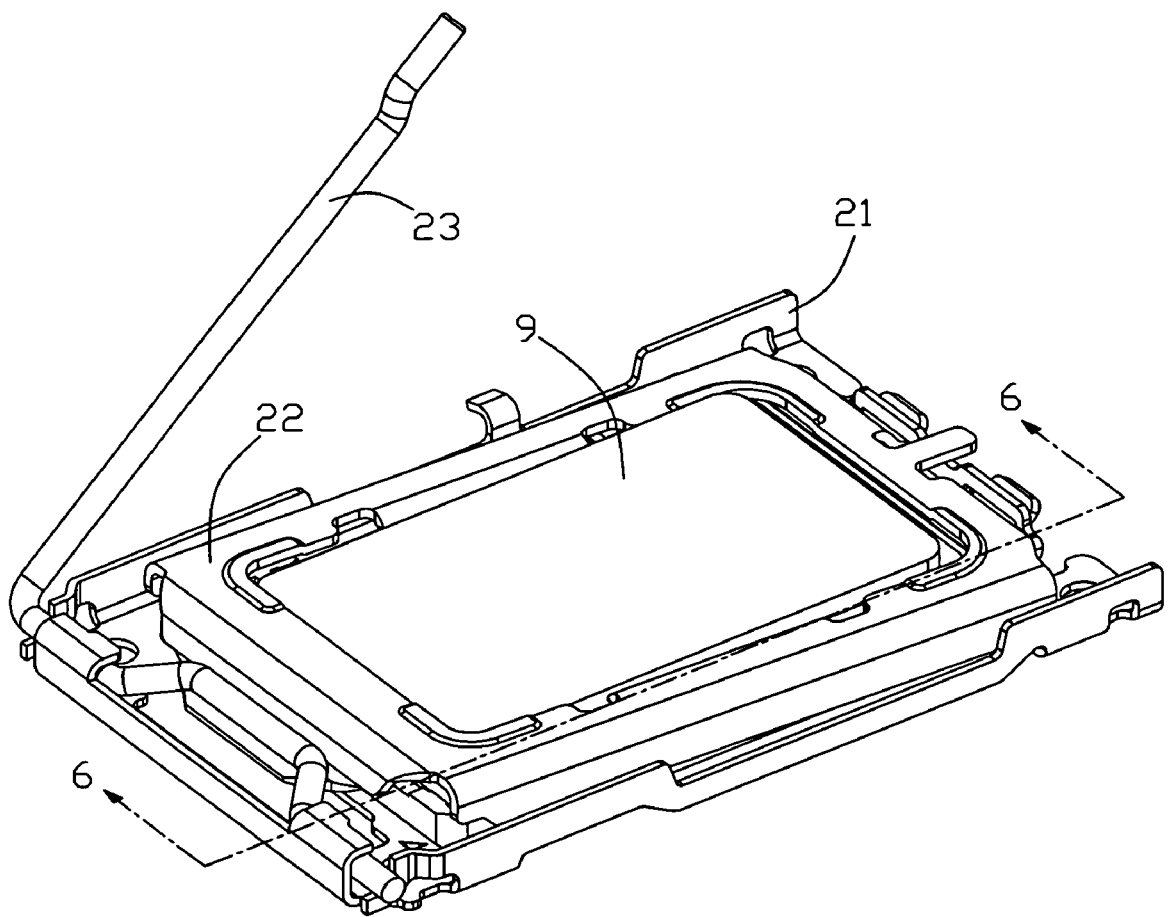
FIG. 5 is an assembled view of the electrical connector, the load lever and the load plate being of unlocked status.
Figure 6:
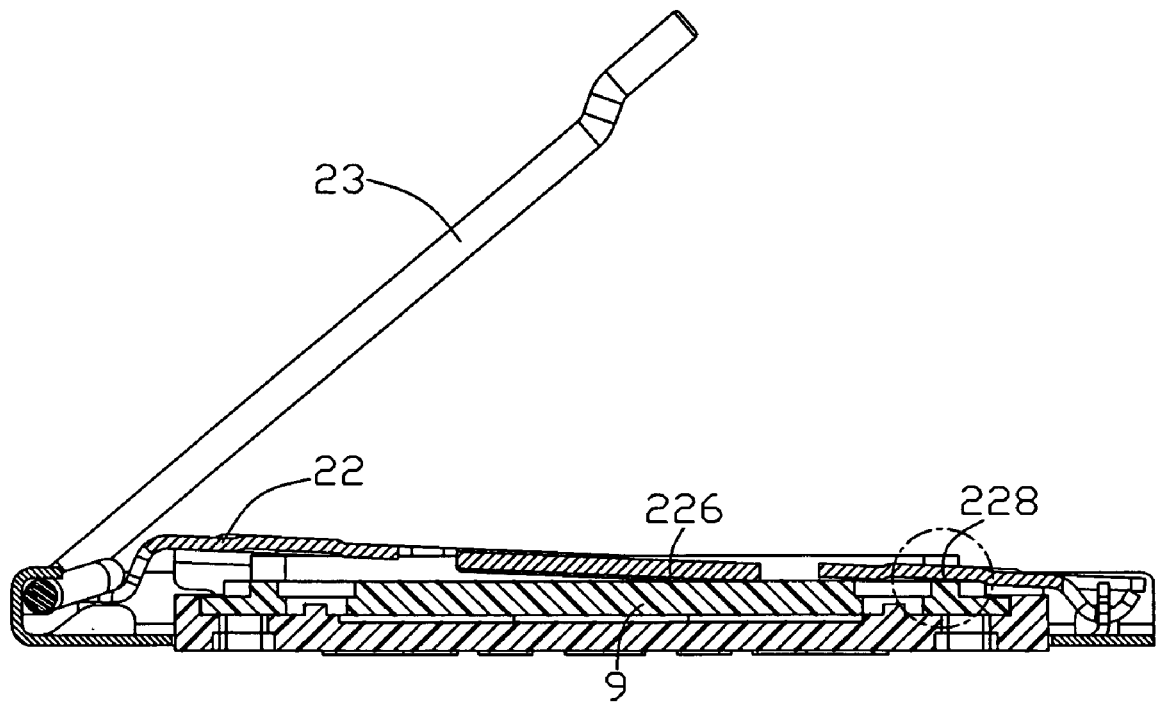
FIG. 6 is a section view taken along line 6-6 of FIG. 5.
Figure 7:
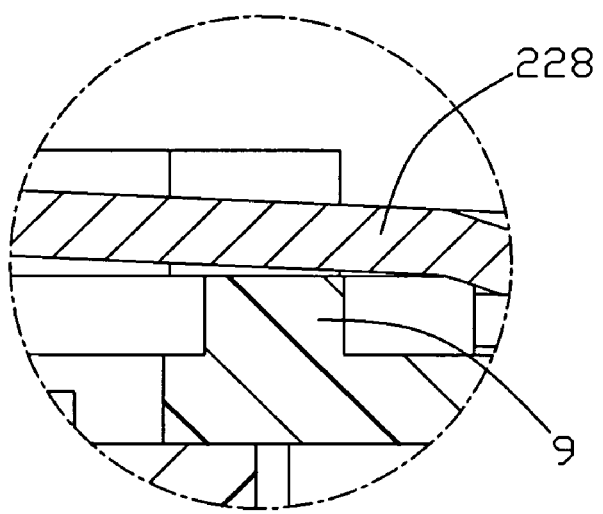
FIG. 7 is an enlarged view of the X portion of FIG. 6.

As shown in FIGS. 1-4, the load plate 22 comprises a first edge 221, a second edge 222 opposite to the first edge 221, a third edge 223 pivoted to the retaining member 21 and a fourth edge 224 adjacent to the first edge 221 and the second edge 222, the four edges jointly defined an opening 225 in middle of the load plate 22 with the first and second edges 221, 222 each having a pressing portion 226. On the load plate 22, corners 227, 228 are arranged near the third edge 223 and defined by the first, third edge 221, 223 and the second, third edge 222, 223; respectively. The corners 227, 228 extend upwardly thus forming recesses on a lower surface of the load plate 22. In detail, the recesses are formed on a lower surface of the first, second and third edges 221, 222, 223. The pressing portions 226 are located on a region apart from said corners 227, 228. Referring to FIGS. 5-7, by above-mentioned way, during the rotation of the load plate 22, the pressing portions 226 will abut against the electronic package 9 prior to the corners 227, 228 near the third edge 223, and thereby prevent the corners 227, 228 from abutting against the electronic package 9. Referring to FIGS. 5-7, when the pressing portion 226 is just beginning to contact with the electronic package 9, a clearance is formed between the electronic package 9 and the corner 228 the third edge 223 of the load plate 23.

In the preferred embodiment of present invention, direction of first edge 221 to the second edge 222 is defined as a transverse direction and direction of third edge 223 to fourth edge 224 is defined as a lengthwise direction. In the transverse direction, the opening 225 has a substantially uniform width so as to form the load plate 22 easily. In this embodiment, the pressing portions 226 are formed by manner of inner walls of the opening 225 extending downwardly, which are located on the first and second edges 221, 222. As an alternative, the pressing portions 226 are protrusions correspondingly located in a lower surface of said edges, respectively. The pressing portions 226 on the first and second edges 221, 222 are disposed in a symmetrical manner with respect to a centerline of the third edge 223. Especially, the pressing portions 226 are located in a center portion of the first and second edges 221, 222, respectively.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electronic package with a circuit substrate, comprising:
   an insulative housing with a plurality of conductive terminals received therein; a fastening device cooperated with the housing for securing the electronic package, comprising:
   a conductive load plate for pressing and securing the electronic package, defining a first edge, a second edge opposite to the first edge, a third edge pivoted to a retaining member and a forth edge adjacent to the first edge and the second edge, and opposite to the third edge, the first, second, third and forth edges jointly connected to each other to define an opening in middle thereof with the first and second edges each having a pressing portion; and
   a conductive securing member for positioning the load plate therein;
   wherein corners between first, second, third and forth edges and the opening of the load plate extend upwardly, thereby defining recesses in the lower surface of the load plate;
   wherein the pressing portions are located on a region apart from said corners;
   wherein when a rotation of the load plate in a closed position, the pressing portions abut against the electronic package, and the corners of the load plate provide spaces between the corners of the load plate and corners of the electronic package so as to prevent the corners of the load plate from abutting against the electronic package;
   wherein the pressing portions are formed by manner of inner walls of the opening extending downwardly, which are located on the first and second edges;
   wherein the pressing portions are located in a center portion of the first and second edges, respectively;
   wherein the securing member includes a retaining member and a load lever pivoted assembled with one end of the retaining member adjacent to the forth edge; and the third edge of the load plate pivoted assembled with the other end of the retaining member; and
   wherein the retaining member is seated surrounding the housing.

2. The electrical connector as claimed in claim 1, wherein a direction of first edge to the second edge is defined as a transverse direction and a direction of the third edge to the fourth edge is defined as a lengthwise direction, and the opening has a substantially uniform width in said transverse direction.

3. The electrical connector as claimed in claim 1, wherein the pressing portions on the first and second edges are disposed in a symmetrical manner with respect to a centerline of the third edge.

* * * * *